(12) United States Patent
Fujimori

(10) Patent No.: US 8,879,273 B2
(45) Date of Patent: Nov. 4, 2014

(54) MOBILE TERMINAL AND CASING CONNECTING STRUCTURE

(75) Inventor: Kotaro Fujimori, Tokyo (JP)

(73) Assignees: Sony Corporation, Tokyo (JP); Sony Mobile Communications Inc., Tokyo (JP)

(*) Notice: Subject to any disclaimer, the term of this patent is extended or adjusted under 35 U.S.C. 154(b) by 470 days.

(21) Appl. No.: 13/178,674

(22) Filed: Jul. 8, 2011

(65) Prior Publication Data
US 2012/0162936 A1   Jun. 28, 2012

Related U.S. Application Data

(60) Provisional application No. 61/426,667, filed on Dec. 23, 2010.

(51) Int. Cl.
| | |
|---|---|
| H05K 1/00 | (2006.01) |
| H05K 7/02 | (2006.01) |
| H01Q 1/24 | (2006.01) |
| H01Q 1/52 | (2006.01) |
| H04M 1/02 | (2006.01) |
| H05K 1/02 | (2006.01) |

(52) U.S. Cl.
CPC .......... *H04M 1/0277* (2013.01); *H04M 1/0235* (2013.01); *H05K 1/0281* (2013.01); *H01Q 1/243* (2013.01); *H01Q 1/52* (2013.01); *H05K 1/0216* (2013.01)
USPC ...... 361/749; 361/679.01; 361/807; 174/254; 174/255; 174/524

(58) Field of Classification Search
USPC ............ 361/749, 814, 679.01, 807, 816, 818, 361/761, 764; 455/575.4, 575.1, 575.5; 174/254, 542, 255; 343/702
See application file for complete search history.

(56) References Cited

U.S. PATENT DOCUMENTS

| | | | | |
|---|---|---|---|---|
| 6,703,702 | B2* | 3/2004 | Inoue et al. | 257/684 |
| 7,593,234 | B2* | 9/2009 | Okuda | 361/749 |
| 7,986,522 | B2* | 7/2011 | Zaitsu | 361/679.55 |
| 8,411,462 | B2* | 4/2013 | Jang et al. | 361/807 |
| 2006/0050490 | A1* | 3/2006 | Ootani | 361/755 |
| 2011/0051381 | A1* | 3/2011 | Sugiyama et al. | 361/749 |
| 2011/0077063 | A1* | 3/2011 | Yabe et al. | 455/575.4 |
| 2012/0087065 | A1* | 4/2012 | Kim et al. | 361/679.01 |

FOREIGN PATENT DOCUMENTS

JP    2009-032098    2/2009

* cited by examiner

*Primary Examiner* — Angel R Estrada
*Assistant Examiner* — Dimary Lopez Cruz
(74) *Attorney, Agent, or Firm* — Oblon, Spivak, McClelland, Maier & Neustadt, L.L.P.

(57) ABSTRACT

A mobile terminal including a first casing, and a second casing connected to the first casing. An electrically conductive plate is disposed inside either of the first casing and the second casing or between the first casing and the second casing. A flexible printed circuit board connects the first casing and the second casing. An electrically conductive reinforcement member is connected to a surface of a portion of the flexible printed circuit board. An electrically conductive connecting member conducts electricity between the electrically conductive reinforcement member and the electrically conductive plate.

17 Claims, 15 Drawing Sheets

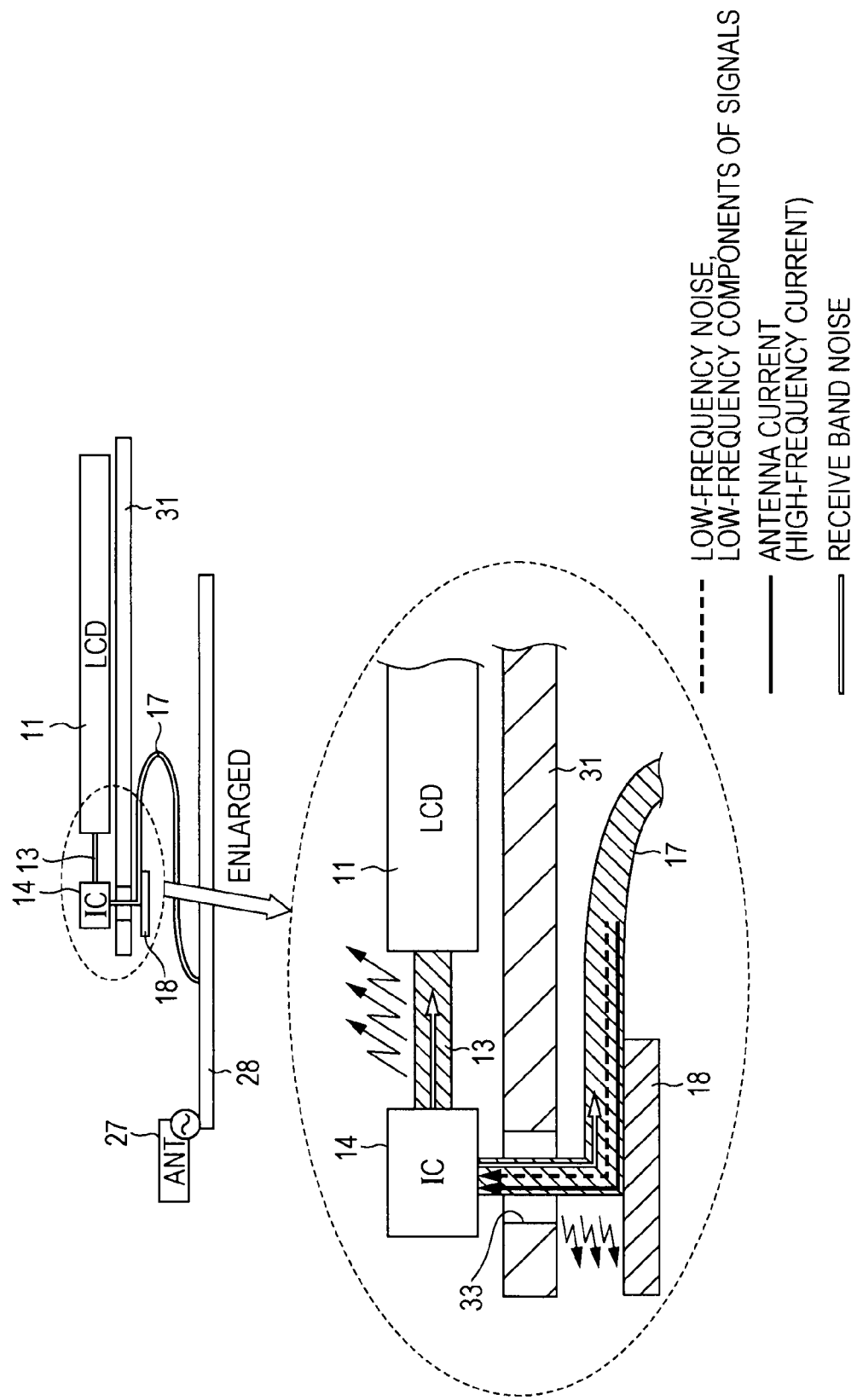

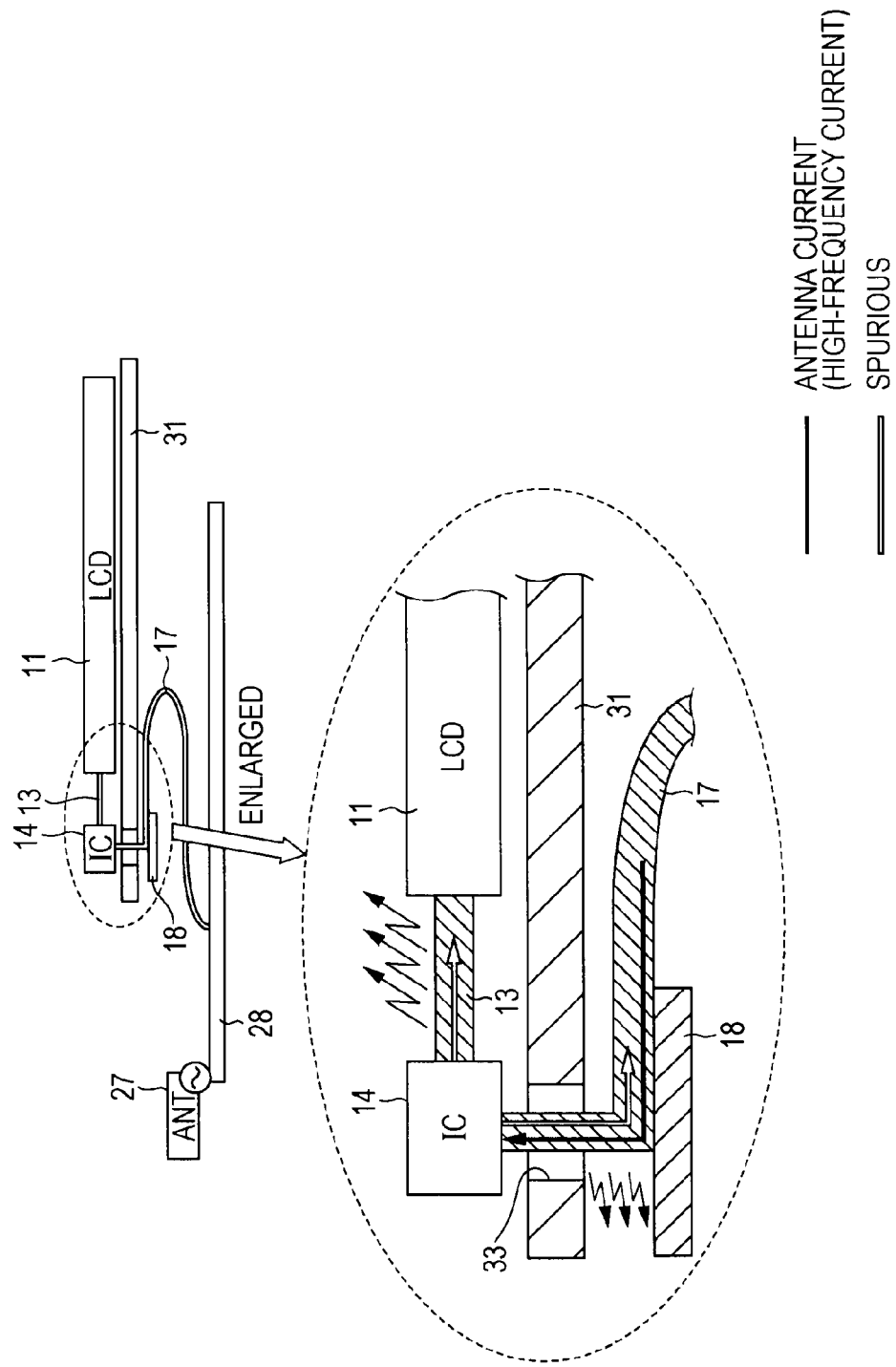

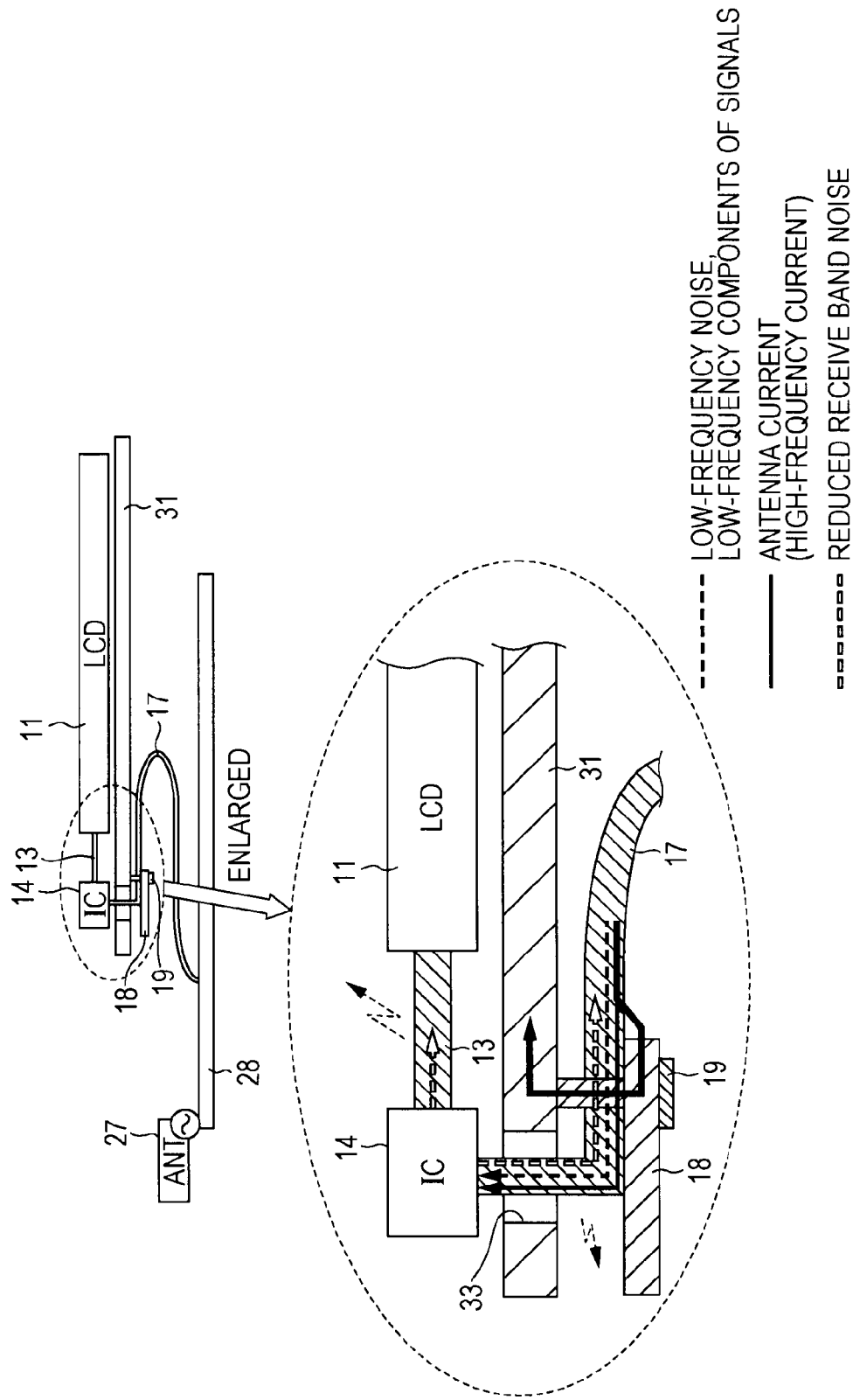

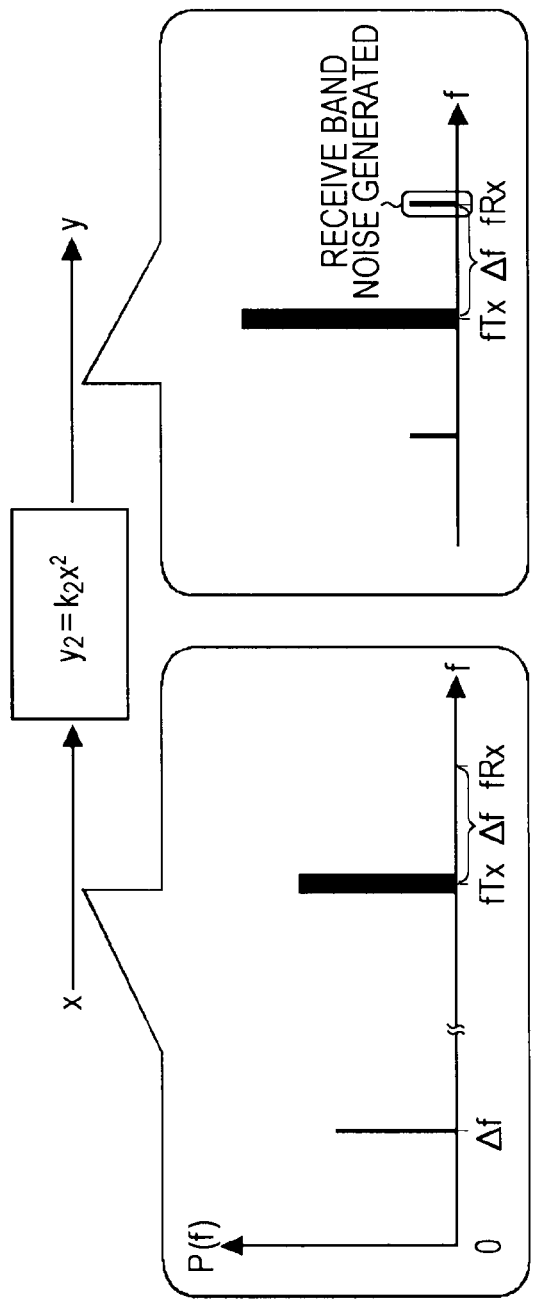

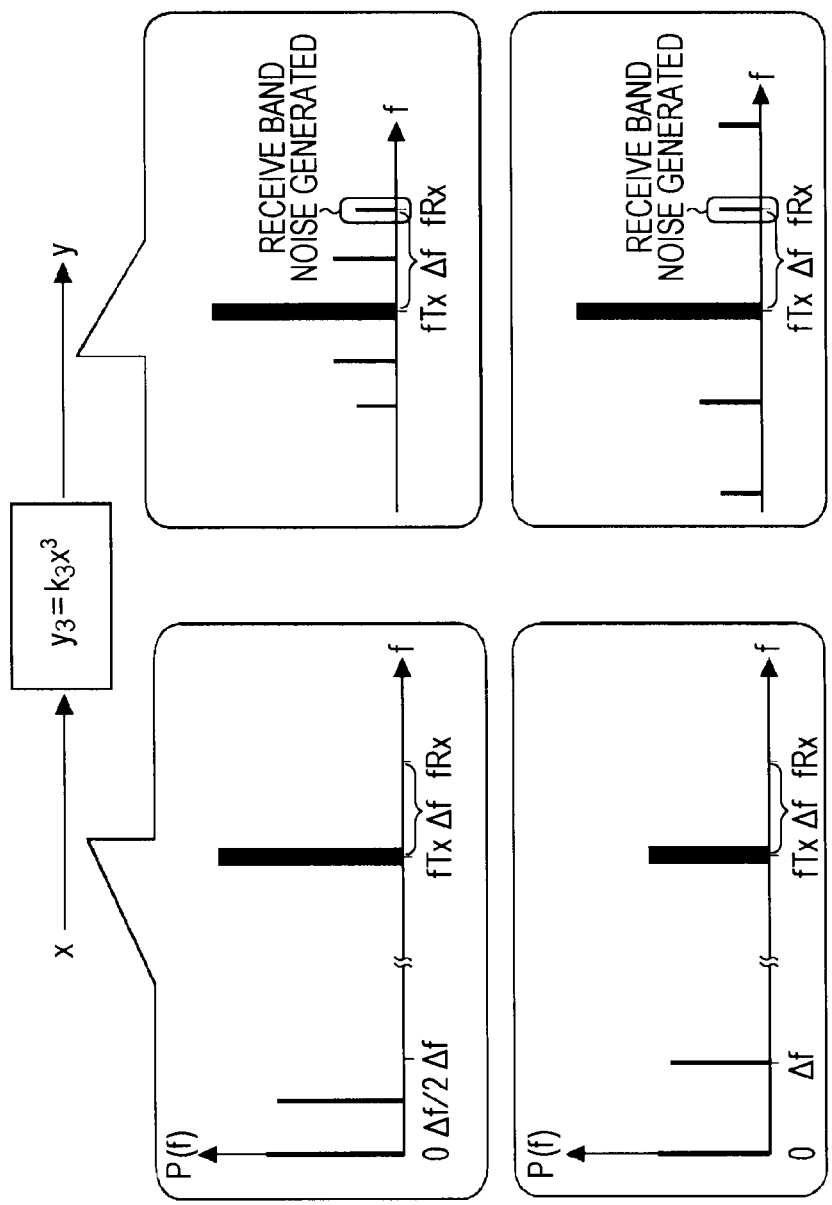

MOBILE TERMINAL AND CASING CONNECTING STRUCTURE

CROSS REFERENCE TO RELATED APPLICATION

This application claims the benefit of priority of Provisional Application Ser. No. 61/426,667, filed Dec. 23, 2010, the entire contents of which is incorporated herein by reference.

BACKGROUND

1. Field of the Disclosure

The present disclosure relates to mobile terminals provided with antennae. In particular, the present disclosure relates to a casing connecting structure that reduces degradation of receiver sensitivity and so forth caused by an antenna current in the mobile terminal that includes first and second casings.

2. Description of Related Art

Presently, some mobile phone terminals in the market are provided with first casings (lower casings) that include display devices such as liquid crystal displays (LCDs) and second casings that include input devices such as tenkeys. In such a mobile phone terminal, one of the first and second casings is slidably connected to the other casing so as to be openable and closable (for example, see Patent Literature 1).

To date, flexible printed circuit boards are used to electrically connect casings relatively movable to each other as described above. Typically, one of the casings is provided with at least one antenna device in order to transmit and receive wireless signals.

To date, the following problems are caused with wireless communication mobile terminals provided with such flexible printed circuit boards (hereinafter abbreviated to FPCs).

The first problem is degradation of receiver sensitivity in a mobile terminal provided with a system that simultaneously performs transmission and reception (for example, CDMA) or in a mobile terminal provided with a plurality of systems in which transmission or reception of the plurality of the systems may be simultaneously performed (for example, long term evolution (LTE) and Bluetooth (registered trade mark)).

For example, a transmission antenna current (high-frequency current) may be introduced into the FPC with low-frequency signals, clock signals, noise, and so forth through the FPC. When such an antenna current is input to an integrated circuit (IC), which is a nonlinear element connected to this FPC, it may cause the nonlinear element to generate receive band noise. The generated noise is introduced into the antenna of a system through space and conductors, thereby degrading receiver sensitivity.

Also in this case, the nonlinear element may generate spurious signals, which may affect surrounding electronics.

Furthermore, when the transmission antenna current is input to a circuit connected to the FPC through the FPC, the circuit may malfunction. For example, in a system in which high-power transmission is performed such as GSM, the transmission antenna current may cause an LCD driver to malfunction, thereby shaking contents displayed on the LCD. A control circuit of an LCD back light may malfunction, thereby flickering contents displayed on the LCD.

SUMMARY OF THE DISCLOSURE

The present disclosure is proposed in view of such a background and intended to prevent or suppress the occurrence of adverse effects caused by an antenna current flowing in an FPC in a mobile terminal provided with an antenna.

A mobile terminal according to an embodiment the present disclosure includes a first casing; a second casing configured to be connected to the first casing; an electrically conductive plate disposed inside either of the first casing and the second casing or between the first casing and the second casing; a flexible printed circuit board configured to connect the first casing and the second casing; an electrically conductive reinforcement member connected to a surface of a portion of the flexible printed circuit board; and an electrically conductive connecting member configured to conduct electricity between the electrically conductive reinforcement member and the electrically conductive plate.

A mobile terminal according to another embodiment the present disclosure includes a first casing; a second casing configured to be connected to the first casing; an electrically conductive plate disposed inside either of the first casing and the second casing or between the first casing and the second casing; a flexible printed circuit board configured to connect the first casing and the second casing; and an electrically conductive sheet member disposed between the flexible printed circuit board and the electrically conductive plate and configured to conduct electricity between the flexible printed circuit board and the electrically conductive plate.

A case connecting structure according to another embodiment the present disclosure includes an electrically conductive plate disposed inside either of the first and second casings or between the first and second casings; a flexible printed circuit board configured to connect the first casing and the second casing; an electrically conductive reinforcement plate secured to a surface of a portion of the flexible printed circuit board; and an electrically conductive connecting member configured to conduct electricity between the reinforcement plate and the electrically conductive plate.

BRIEF DESCRIPTION OF THE DRAWINGS

FIG. 4 includes a side view of the main components and an enlarged view of the main portion of the main components of the mobile terminal and is used to describe generation of receive band noise, which affects receiver sensitivity of a system;

FIG. 5 includes a side view of the main components and an enlarged view of the main portion of the main components of the mobile terminal and is used to describe generation of spurious, which affects surrounding electronics;

FIG. 6 illustrates an example configuration according to a first embodiment of the present disclosure;

FIG. 7 is an explanatory diagram illustrating generation of receive band noise (second-order distortion);

FIG. 8 is an explanatory diagram illustrating generation of receive band noise (third-order distortion);

DESCRIPTION

Embodiments according to the present disclosure will be described below in detail with reference to the accompanying drawings.

Figure 1A:
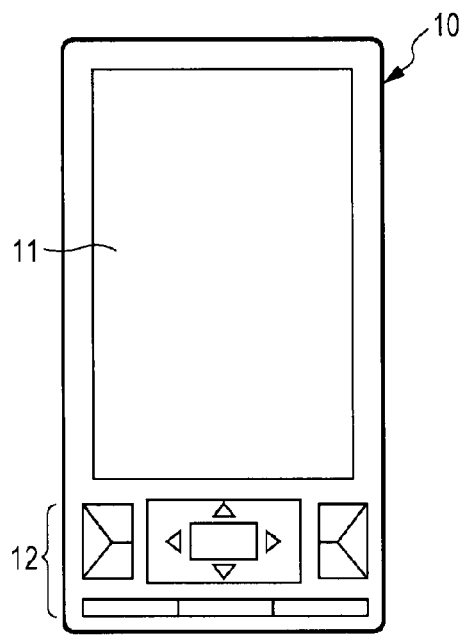
FIGS. 1A and 1B illustrate the appearance of a mobile terminal according to the present disclosure.
Figure 1B:
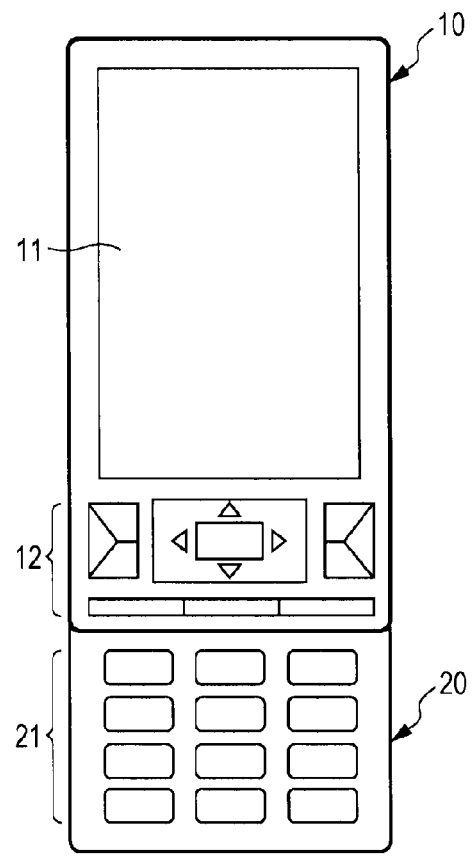

FIGS. 1A and 1B illustrate the appearance of a mobile terminal according to the present disclosure. This mobile terminal includes a first casing (upper casing) 10 and a second casing (lower casing) 20. One of the casings is slidably connected to the other casing so as to be openable and closable. FIG. 1A illustrates a closed state in which the second casing 20 overlaps the first casing 10 at the back of the first casing. FIG. 1B illustrates an open state in which the second casing 20 slides out from the back of the first casing 10.

A main area of the first casing (upper casing) 10 includes an LCD 11 as a display device. An input device 12, which is a first operating portion including direction designation keys and various operation keys, is disposed below the LCD 11.

An input device 21, which is a second operating portion including a tenkey, is disposed in a portion, which is exposed in the open state, of the second casing (lower casing) 20.

Figure 2A:
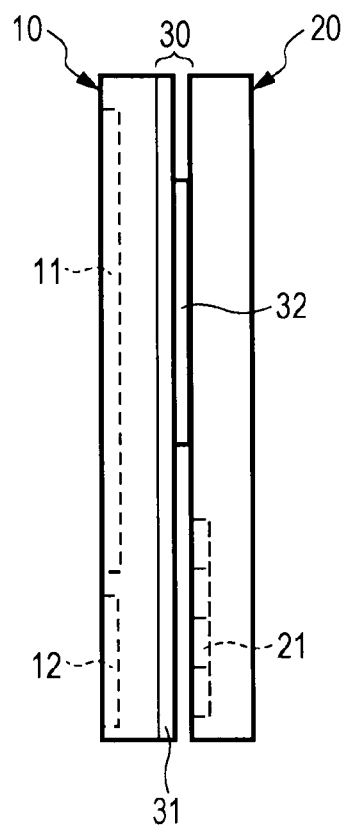
FIG. 2A is a side view illustrating a closed state in which a second casing overlaps a first casing at the back of the first casing.
Figure 2B:
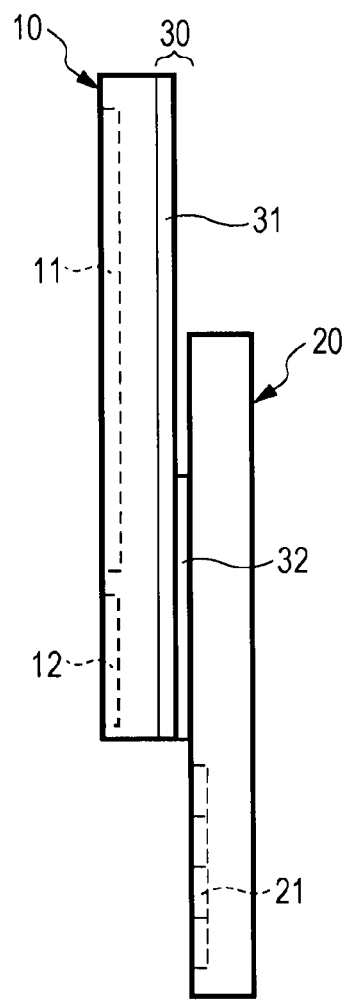
FIG. 2B is a side view illustrating an open state in which the second casing slides out from the back of the first casing.

FIGS. 2A and 2B are side schematic diagrams that respectively illustrate the closed state and the open state. FIGS. 2A and 2B will be used to describe an open and close mechanism of the mobile terminal illustrated in FIGS. 1A and 1B. In FIGS. 2A and 2B, components similar to those illustrated in FIGS. 1A and 1B are denoted by like reference numerals and detailed descriptions thereof are omitted. This is also true for other following figures.

A slide connecting member 30 is disposed between the upper casing 10 and the lower casing 20. The slide connecting member 30 connects the upper casing 10 to the lower casing 20 such that the upper and lower casings 10 and 20 are slidable relative to each other. The slide connecting member 30 includes a fixed plate 31 and a movable plate 32 that is slidably connected to the fixed plate 31. The fixed plate 31 and the movable plate 32 are formed of a stiff and electrically conductive material such as metal or alloy. The structure of the slide connecting member 30 as described above itself is a known technology. In the present embodiment, the fixed plate 31 corresponds to an "an electrically conductive plate that is disposed inside either of the first and second casings or between the casings" of the present disclosure.

Figure 3A:
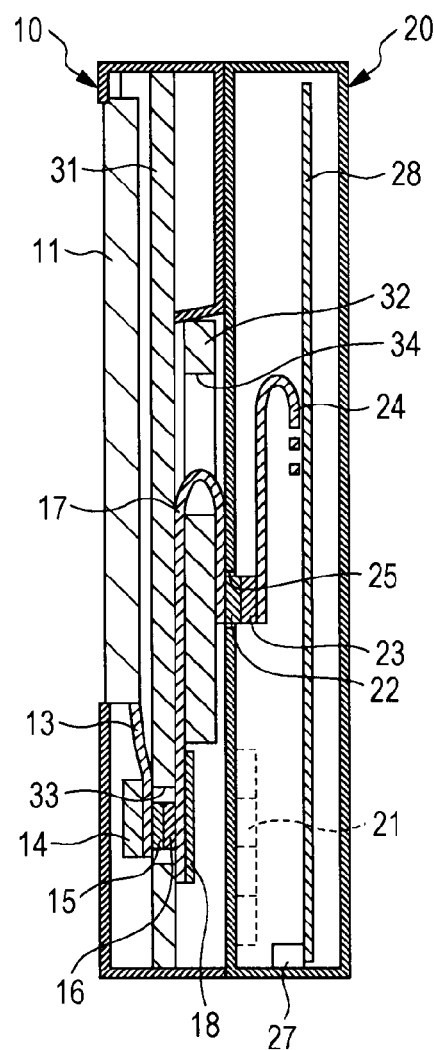
FIGS. 3A and 3B correspond to FIGS. 2A and 2B respectively, and illustrate a general structure inside both of the casings according to the present disclosure.
Figure 3B:
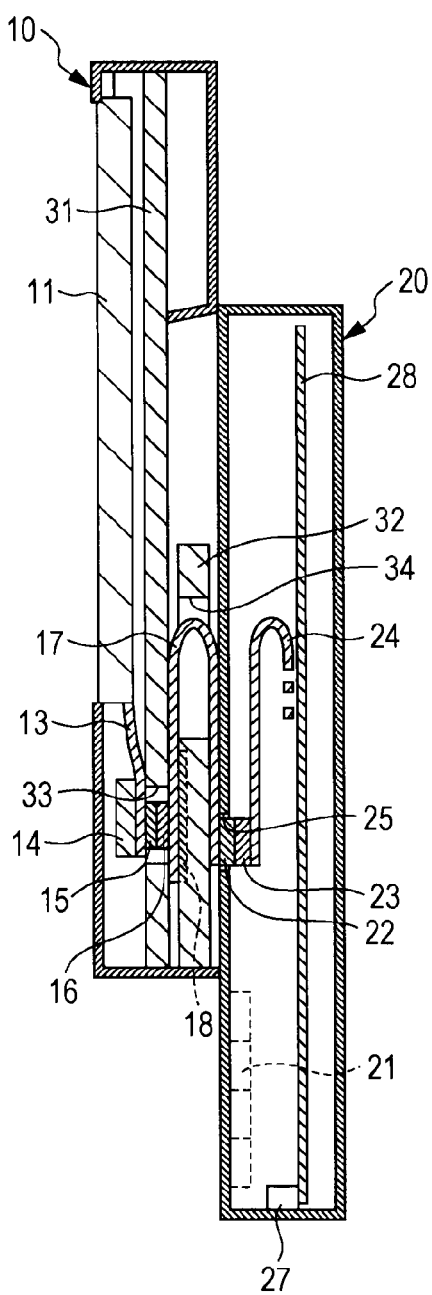

FIGS. 3A and 3B correspond to FIGS. 2A and 2B respectively, and illustrate a general structure inside both of the casings according to the present disclosure.

As described above, the LCD 11 is disposed in the upper casing 10. Display data and control signals are supplied to the LCD 11 through an FPC 13. An integrated circuit (IC) 14 is disposed on the FPC 13 as an electronic component including a nonlinear element. A connector 15 is disposed at an end of the FPC 13. The connector 15 faces an opening 33 formed on the fixed plate 31 of the slide connecting member 30 and is mechanically and electrically connected to a connector 16 that faces the opening 33 from a back side of the fixed plate 31. The connector 16 is disposed in one end of a relay FPC 17. To make the end portion of the relay FPC 17 robust and to credibly maintain a connected state with connector 16 disposed therein, a reinforcement plate 18 is secured (bonded here) to a portion of the relay FPC 17 behind which the connector 16 is disposed.

The relay FPC 17 provides an electrically conductive path in order to electrically connect the upper casing 10 to the lower casing 20. The relay FPC 17 extends upward from the end on the connector 15 side on the front surface side of the movable plate 32 (left side in FIGS. 3A and 3B), passes through an opening 34, bends downward at the back surface side of the movable plate 32, and is connected to a connector 22 of the other end.

The connector 22 faces an opening 25 formed on a front surface of the lower casing 20 and is mechanically and electrically connected to a connector 23 disposed inside the lower casing 20. The connector 23 is also connected to an FPC 24 and is connected to a circuit board 28 disposed inside the lower casing 20.

The length of the relay FPC 17 and the size of the opening 34 are determined so as not to limit the movement of the movable plate 32 entirely in a target movable range when the movable plate 32 moves relative to the fixed plate 31.

An antenna 27 for wireless communications is disposed at a lower end of the interior of the lower casing 20. The antenna 27 is not necessarily disposed at this position. For example, the antenna 27 may instead be disposed at an upper end of the lower casing 20. Alternatively, the antenna 27 is disposed in the upper casing 10 instead of the lower casing 20. Although the antenna 27 is assumed to be incorporated in the mobile terminal, the antenna 27 is not necessarily an incorporated antenna.

As illustrated in FIG. 3B, the reinforcement plate 18 partly overlaps the movable plate 32 in the side view of the mobile terminal. However, the actual movable plate 32 in the movement moves so as to slide over the reinforcement plate 18. Thus, the reinforcement plate 18 does not interfere with the movement of the movable plate 32.

For clearer understanding of the present disclosure, problems with a mobile terminal having a structure as illustrated in FIGS. 1 to 3 will be described.

FIG. 4 includes a side view of main components and an enlarged view of the main portion of the main components of the mobile terminal according to the present disclosure. In FIG. 4, the movable plate 32 is omitted for the purpose of convenience.

As described in the related art above, through the relay FPC 17 together with low-frequency signals, clock signals, noise and so forth, a transmission antenna current (high-frequency current) is input to the IC 14, which is a nonlinear element connected to the FPC 17. This causes receive band noise to be generated from the IC 14. The generated noise is introduced into the antenna 27 through space and conductors, thereby degrading receiver sensitivity. FIG. 4 illustrates "low-frequency noise and (low-frequency components of) signals", which are supposed to be input to the LCD. The "antenna current (high-frequency current)" is unintentionally introduced into the FPC 17 and the "receive band noise" is generated in the IC 14.

Also in this case, as illustrated in FIG. 5, the IC 14 may generate spurious signals that affect surrounding electronics. Spurious refers to electrical waves other than desired signals out of those electrical waves generated by a mobile terminal. In particular in this example, the spurious waves mainly include a harmonic component of a transmission frequency.

Here, principles of generation of receive band noise (second-order distortion) will be described with reference to FIG. 7.

The relationship between the input and output of an element whose input/output characteristic is nonlinear can be represented as follows:

$$y = k_0 + k_1 x + k_2 x^2 + k_3 x^3 + \ldots \quad (1)$$

Now, it is assumed that an input signal is x, and a signal at frequency f1 and a signal at frequency f2 are given:

$$x = a_1 \cos(2\pi f_1 t) + a_2 \cos(2\pi f_2 t) \quad (2)$$

When looking at a second order term of expression (1), it can be understood that a component at a frequency (f1±f2) is generated as a result:

$$y_2 / k_2 = x^2 \quad (3)$$
$$= (a_1 \cos(2\pi f_1 t) + a_2 \cos(2\pi f_2 t))^2$$
$$= a_1 a_2 \cos(2\pi (f_1 + f_2)t) + a_1 a_2 \cos(2\pi (f_1 - f_2)t) + \ldots$$

where $y_2$ represents the second-order term of y.

For example, in a system in which a frequency spacing between transmission and reception is given by Δf (transmission frequency fTx and reception frequency fRx=fTx+Δf), it is assumed that a transmission signal of a transmission frequency fTx and a signal (or may be noise) of a frequency component Δf are input to a nonlinear element. In this case, as clearly seen from expression (3), a frequency fTx+Δf, that is, a distortion component in the reception frequency, is generated due to the second-order distortion of the nonlinear element.

In a system in which a transmission frequency is fTx and a reception frequency is fRx=fTx+Δf, a frequency component in question is (f1−f2) of expression (3).

Next, principles of generation of receive band noise (third-order distortion) will be described with reference to FIG. 8. In this case, look at a third-order term of expression (1):

$$y_3 / k_3 = x^3 \quad (4)$$
$$= (a_1 \cos(2\pi f_1 t) + a_2 \cos(2\pi f_2 t))^3$$
$$= \frac{3}{2} a_1 a_2^2 \cos(2\pi f_1 t) + \ldots$$

where $y_3$ represents the third-order term of y.

Here, when, for example, a2 has been amplitude-modulated, a2 is represented as follows:

$$a_2 \rightarrow a_2(1 m \cos(2\pi f_{AM} t)) \quad (5)$$

A first term of expression (4) can be expanded as an expression described below:

$$\frac{3}{2} a_1 a_2^2 (1 + m\cos(2\pi f_{AM} t))^2 \cos(2\pi f_1 t) = \frac{3}{2} a_1 a_2^2 \left(1 + \frac{m^2}{2}\right) \cos(2\pi f_1 t) + \quad (6)$$

-continued
$$\frac{3}{2} a_1 a_2^2 m \cos(2\pi (f_1 - f_{AM})t) + \frac{3}{2} a_1 a_2^2 m \cos(2\pi (f_1 + f_{AM})t) +$$
$$\frac{3}{8} a_1 a_2^2 m^2 \cos(2\pi (f_1 - 2 f_{AM})t) + \frac{3}{8} a_1 a_2^2 m^2 \cos(2\pi (f_1 + 2 f_{AM})t)$$

For example, in a system in which a frequency spacing between transmission and reception is given by Δf (transmission frequency fTx and reception frequency fRx=fTx+Δf), it is assumed that a transmission signal of a transmission frequency fTx and a signal (or may be noise) of an amplitude-modulated frequency Δf or 0.5 Δf are input to a nonlinear element. In this case, as clearly seen from expression (6), a frequency fTx+Δf, that is, a distortion component in the reception frequency is generated, due to the third-order distortion of the nonlinear element.

In a system in which a transmission frequency is fTx and a reception frequency is fRx=fTx+Δf, a frequency component in question is (f1−$f_{AM}$) or (f1−2$f_{AM}$) of expression (6).

In either of the above-described cases, introduction of the antenna current that flows in the FPC into the nonlinear element causes a problem. The present disclosure solves the problem by branching at least part of the antenna current that flows in the FPC into a path away from the nonlinear element, and as a result, reducing the antenna current that flows into the nonlinear element.

FIG. 6 illustrates an example configuration according to a first embodiment of the present disclosure.

In the first embodiment, part of the antenna current is branched into the fixed plate 31 by coupling the reinforcement plate 18 for the FPC 17 to the fixed plate 31 (providing DC connection therebetween) through an electrically conductive connecting member 19.

This reduces the amount of the current that flows into the nonlinear element (IC 14). In this figure, a resist layer on the surface of the FPC 17 isolates GND and other lines of the FPC 17 from the reinforcement plate 18. Thus, direct current (DC) does not flow between the reinforcement plate 18 and the FPC 17. However, since the FPC 17 and the reinforcement plate 18 are disposed close to each other so as to be capacitively coupled, alternating current (AC) flows between the reinforcement plate 18 and the FPC 17. Thus, only the high-frequency antenna current is branched, and the low-frequency signals and noise flowing in the FPC 17 are not branched.

Alternatively, the reinforcement plate 18 and the FPC 17 can be coupled to each other so as to allow DC to flow therebetween (to do this, it is sufficient to remove the resist layer over the GND line of the FPC).

A position where the antenna current branches is not limited to a position illustrated in FIG. 6. The branching position may be a different position in the FPC 17.

Figure 9:
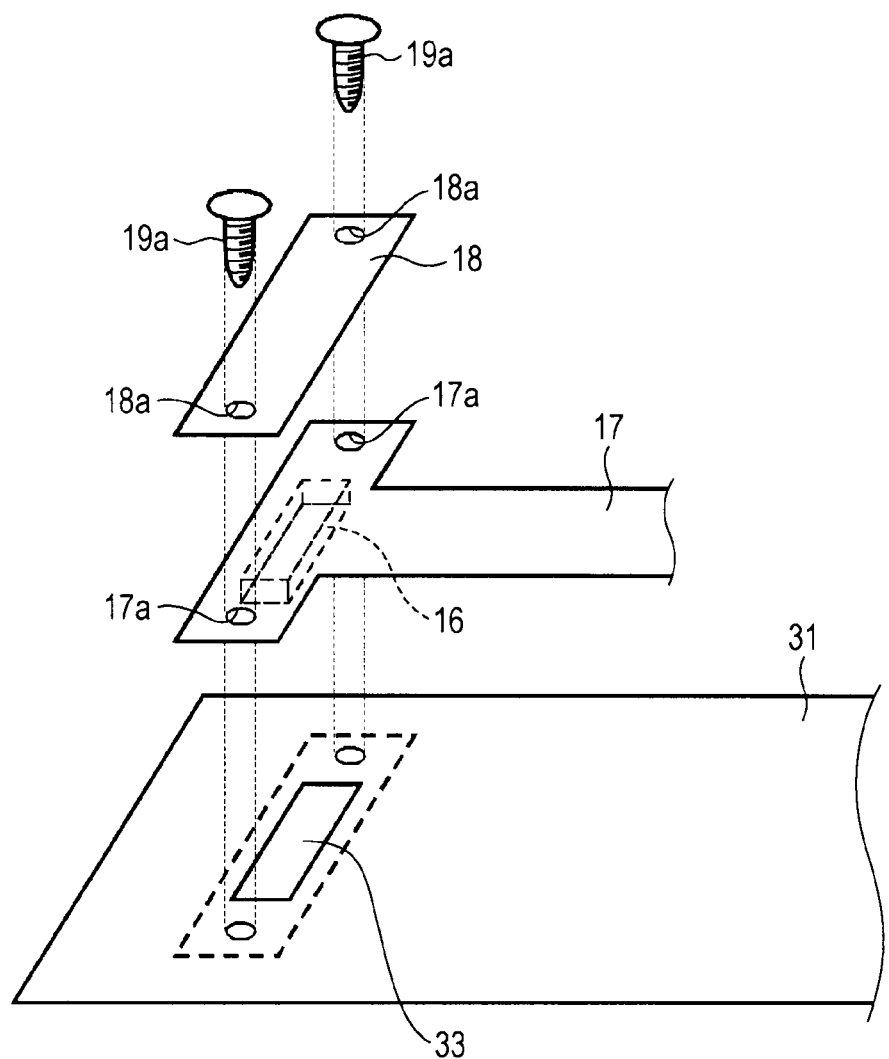
FIG. 9 is a perspective view illustrating a specific example according to the first embodiment illustrated in FIG. 6.

FIG. 9 illustrates an example in which metal (electrically conductive) screws 19a are used as a specific example of electrically conductive connecting members that connect the reinforcement plate 18 and the fixed plate 31 according to the first embodiment illustrated in FIG. 6. The screws 19a are screwed into the fixed plate 31 through screw holes 18a formed in the reinforcement plate 18 and screw holes 17a formed in the FPC 17.

By connecting the reinforcement plate 18, which is coupled to the FPC 17 so as to allow AC to flow therebetween, as described above to the fixed plate 31 through the screws 19a, part of the antenna current (high-frequency current) having been introduced into the FPC 17 is released to the fixed plate 31. This reduces the antenna current that flows into the nonlinear element connected to the FPC 17, and reduces various problems caused by the antenna current.

The electrically conductive connecting member is not limited to the screw 19a. Other certain electrically conductive fastening members may alternatively be used.

Figure 10:
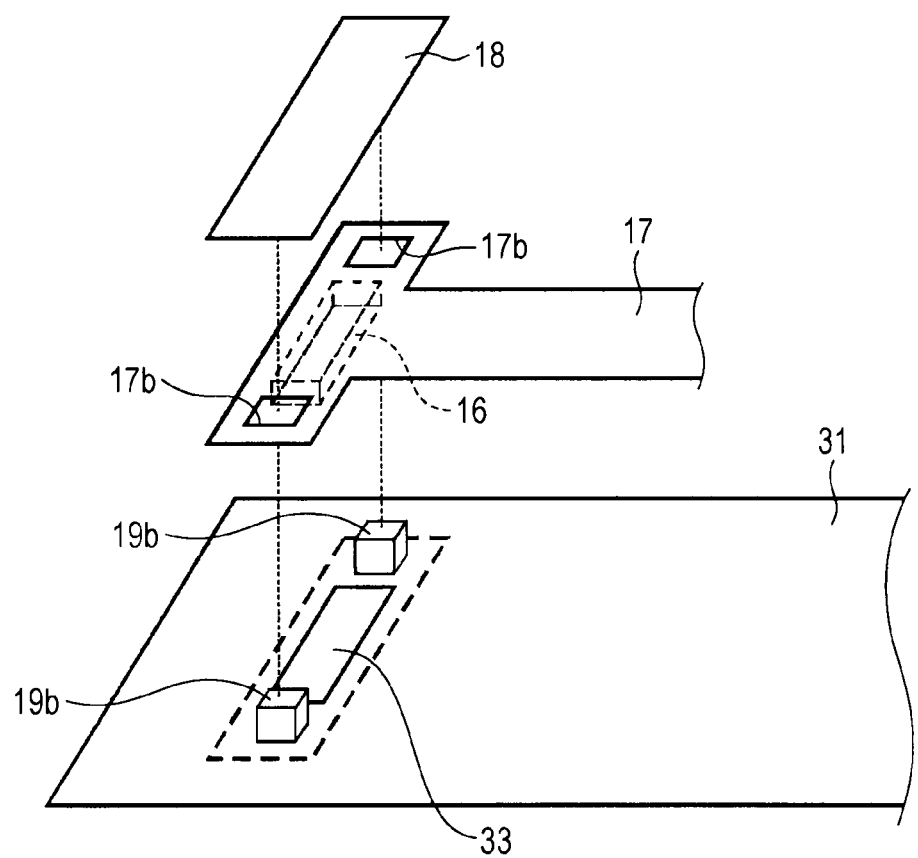
FIG. 10 is a perspective view illustrating another specific example according to the first embodiment illustrated in FIG. 6.

FIG. 10 illustrates an example in which gaskets 19b, which are electrically conductive elastic members, are used as another specific example of the electrically conductive connecting members that connect the reinforcement plate 18 and the fixed plate 31 according to the first embodiment illustrated in FIG. 6. As in the case described above, the reinforcement plate 18 is bonded to the surface at the end of the FPC 17. In the other surface of the FPC 17 opposite the above-described surface, a peripheral portion at the end of the FPC 17 (portion corresponds to a peripheral portion around the opening 33) is bonded to a surface of the fixed plate 31. This causes the gaskets 19b, which are bonded to the fixed plate 31 with electrically conductive adhesive (adhesive tape), to come into contact with the reinforcement plate 18 by being pressed against and through openings 17b formed in the FPC. In the present example, two gaskets 19b are used. However, the number of gaskets 19b may instead be one or more than or equal to three. This structure is useful as a waterproof structure where tightness of the casings is ensured.

As in the case with FIG. 9, the resist layer on the surface of the FPC 17 isolates GND and other lines of the FPC 17 from the reinforcement plate 18. Thus, the reinforcement plate 18 and the FPC 17 are not coupled to each other so as to allow direct current (DC) to flow therebetween. However, since the reinforcement plate 18 and the FPC 17 are disposed close to each other so as to be capacitively coupled, alternating current (AC) flows therebetween.

By connecting the reinforcement plate 18, which is coupled to the FPC 17 so as to allow AC to flow therebetween, as described above to the fixed plate 31 through the gaskets 19b, part of the antenna current (high-frequency current) having been introduced into the FPC 17 is released to the fixed plate 31. This reduces the antenna current that flows into the nonlinear element connected to the FPC 17, and reduces various problems caused by the antenna current.

Figure 11:
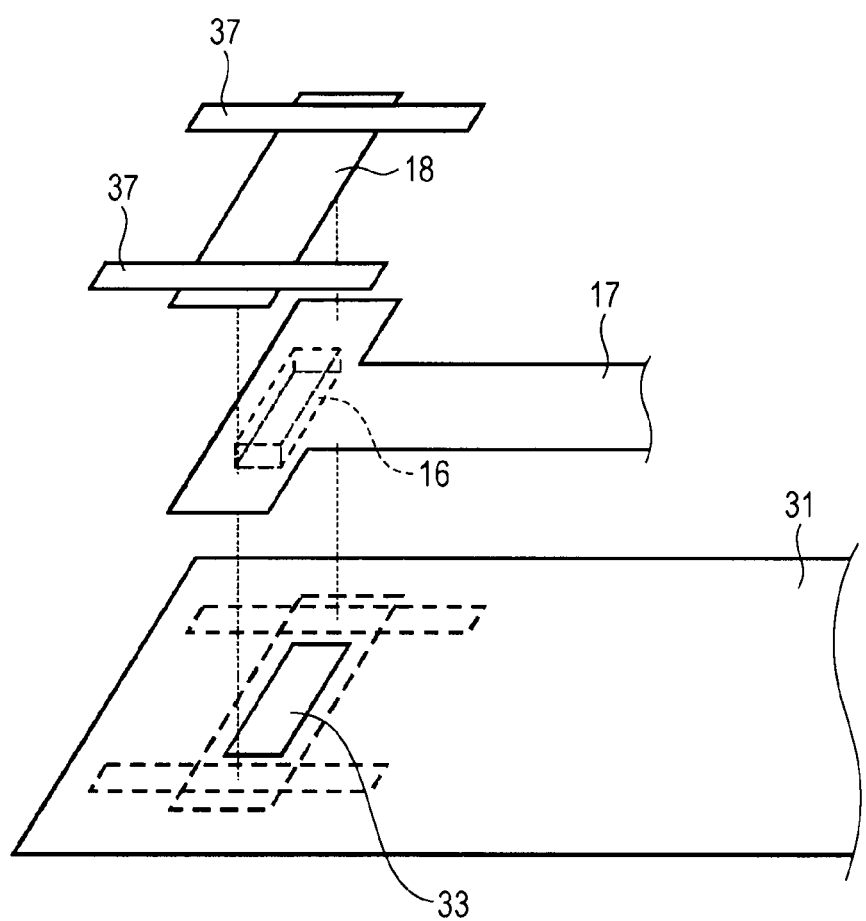
FIG. 11 is a perspective view illustrating still another specific example according to the first embodiment illustrated in FIG. 6.

FIG. 11 illustrates a still another specific example of the electrically conductive connecting members that connect the reinforcement plate 18 and the fixed plate 31 according to the first embodiment illustrated in FIG. 6. In this specific example, an electrically conductive tape 37 is used as an electrically conductive tape-shaped member. In an example in the figure, two pieces of the electrically conductive tape 37 extend so as to cross the reinforcement plate 18 at its ends and are bonded to the fixed plate 31. The reinforcement plate 18 reinforces from the back the end of the FPC 17 where the connector 16 is connected. This adhesive or an adhesive layer is electrically conductive. The number of pieces of the electrically conductive tape 37 is not limited to two. At least one piece of the electrically conductive tape 37 is sufficient.

By connecting the reinforcement plate 18, which is coupled to the FPC 17 so as to allow AC to flow therebetween, as described above to the fixed plate 31 through the electrically conductive tape 37, part of the antenna current (high-frequency current) having been introduced into the FPC 17 is released to the fixed plate 31. This reduces the antenna current that flows into the nonlinear element connected to the FPC 17, and reduces various problems caused by the antenna current.

To be exact, in any structure of the above-described first embodiment, low-frequency signals and noise are also introduced into the fixed plate 31 although the ratios thereof compared to that of the antenna current (high-frequency current) are small.

To address this, pre-defined regulator circuits can be provided in paths that connect the FPC 17 to the fixed plate 31 in order to improve frequency selectivity. In this case, the low-frequency signals and the noise that flow from the FPC 17 into the fixed plate 31 are further reduced.

Figure 12:
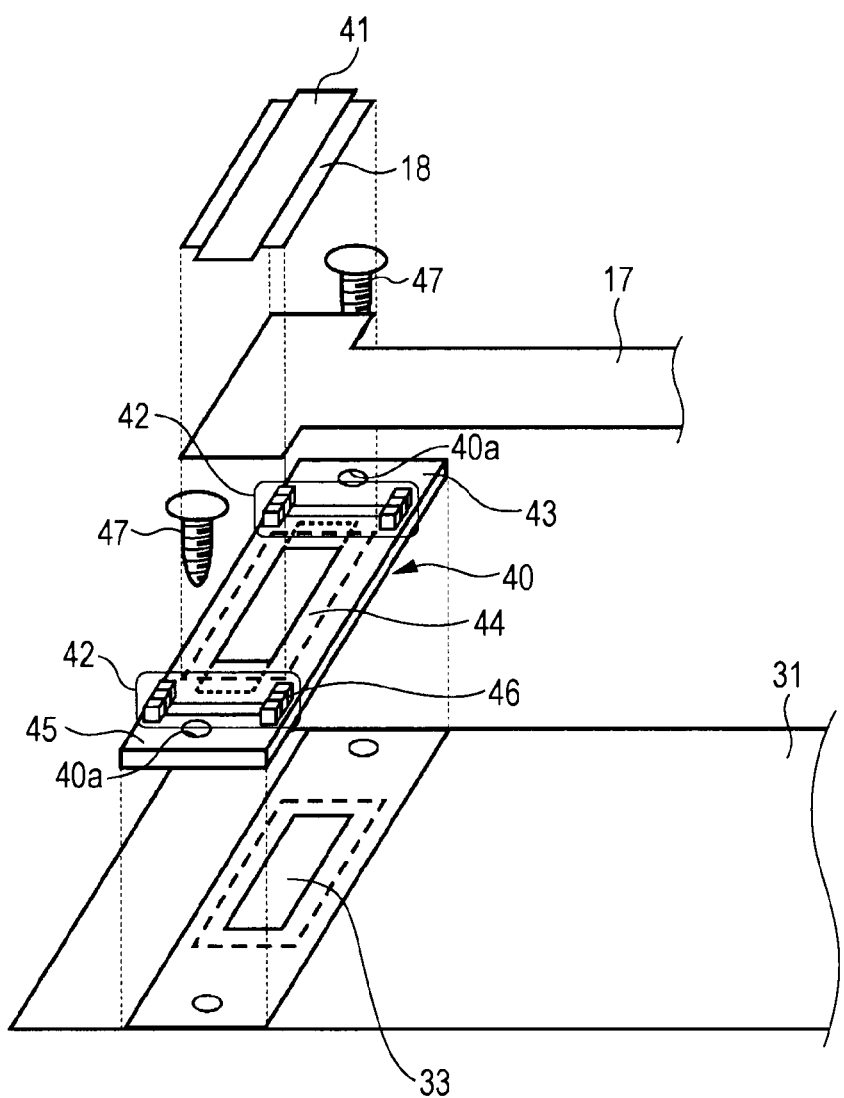
FIG. 12 is a perspective view illustrating an example of a modification to the first embodiment of the present disclosure.

FIG. 12 illustrates an example of a modification to the first embodiment in order to achieve such an object. As an example of this modification, FIG. 11 illustrates a configuration example in which regulator circuits 42 are inserted between the reinforcement plate 18 and the fixed plate 31 in order to improve frequency selectivity. Each regulator circuit 42 is assumed to be a circuit having frequency selectivity such as a filter including predetermined circuit elements or a filter including a distributed constant circuit. The predetermined circuit elements, for example, include at least one of an inductor L and a capacitor C or a combination of these components, or further include a resistor R.

A circuit board 40, in which the regulator circuits 42 are formed, includes three electrical conductor areas (A, B, and C) 43, 44 and 45, which are not coupled to each other so as to allow DC to flow thereamong (separated from each other). One of the two regulator circuits 42 is disposed between the electrical conductor areas B and A, the other regulator circuit 42 is disposed between the electrical conductor areas B and C. The electrical conductor areas A and C include screw holes 40a and are connected to the fixed plate 31 through metal (electrically conductive) screws 47. In addition, the conductor area B is connected to and electrically conductive with the reinforcement plate 18 through electrically conductive tape 41. In the illustrated example, portions of the electrically conductive tape 41 that extend in the longitudinal direction of the reinforcement plate 18 and protrude beyond the ends of the reinforcement plate 18 (and the end of the FPC 17 that overlaps the reinforcement plate 18) contact the electrical conductor area B. With this structure, the electrical conductor area B of the circuit board is connected to the electrical conductor areas A and C of the circuit board through the regulator circuits 42.

According to the present disclosure, the screws 47 and the electrically conductive tape 41 are not necessarily used. Other certain electrically conductive connecting members as described above may instead be used.

Figure 13:
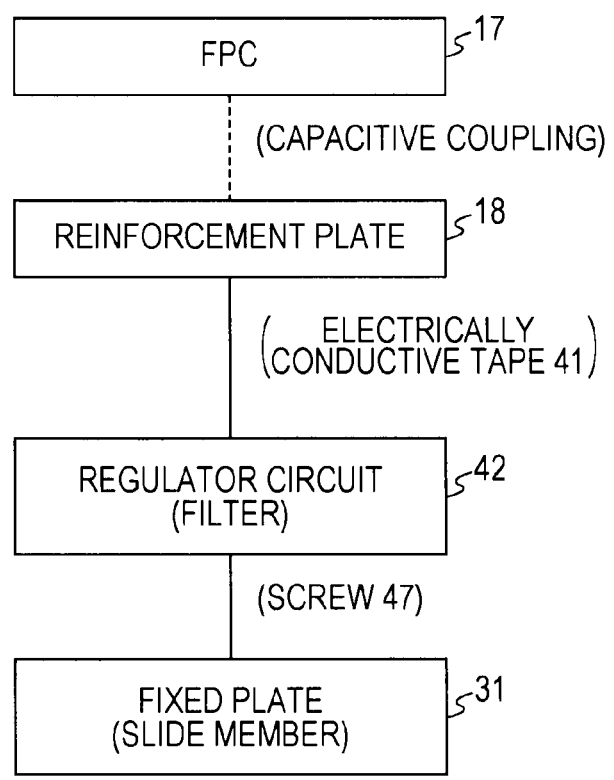
FIG. 13 is an explanatory diagram illustrating a conductive path of an antenna current from an FPC including a regulator circuit illustrated in the example of the modification in FIG. 12.

FIG. 13 illustrates a conductive path of the antenna current from the FPC 17 including the regulator circuit 42. By connecting the reinforcement plate 18, which is coupled to the FPC 17 so as to allow AC to flow therebetween using the capacitive coupling, to the fixed plate 31 through the electrically conductive tape 41, the regulator circuit 42, and the screw 47, part of the antenna current (high-frequency current) having been introduced into the FPC 17 is released to the fixed plate 31. This reduces the antenna current that flows into the nonlinear element connected to the FPC, and reduces various problems caused by the antenna current. In addition, the regulator circuit 42 improves frequency selectivity. This can prevent a current at an unintentional frequency band from flowing out.

Figure 14:
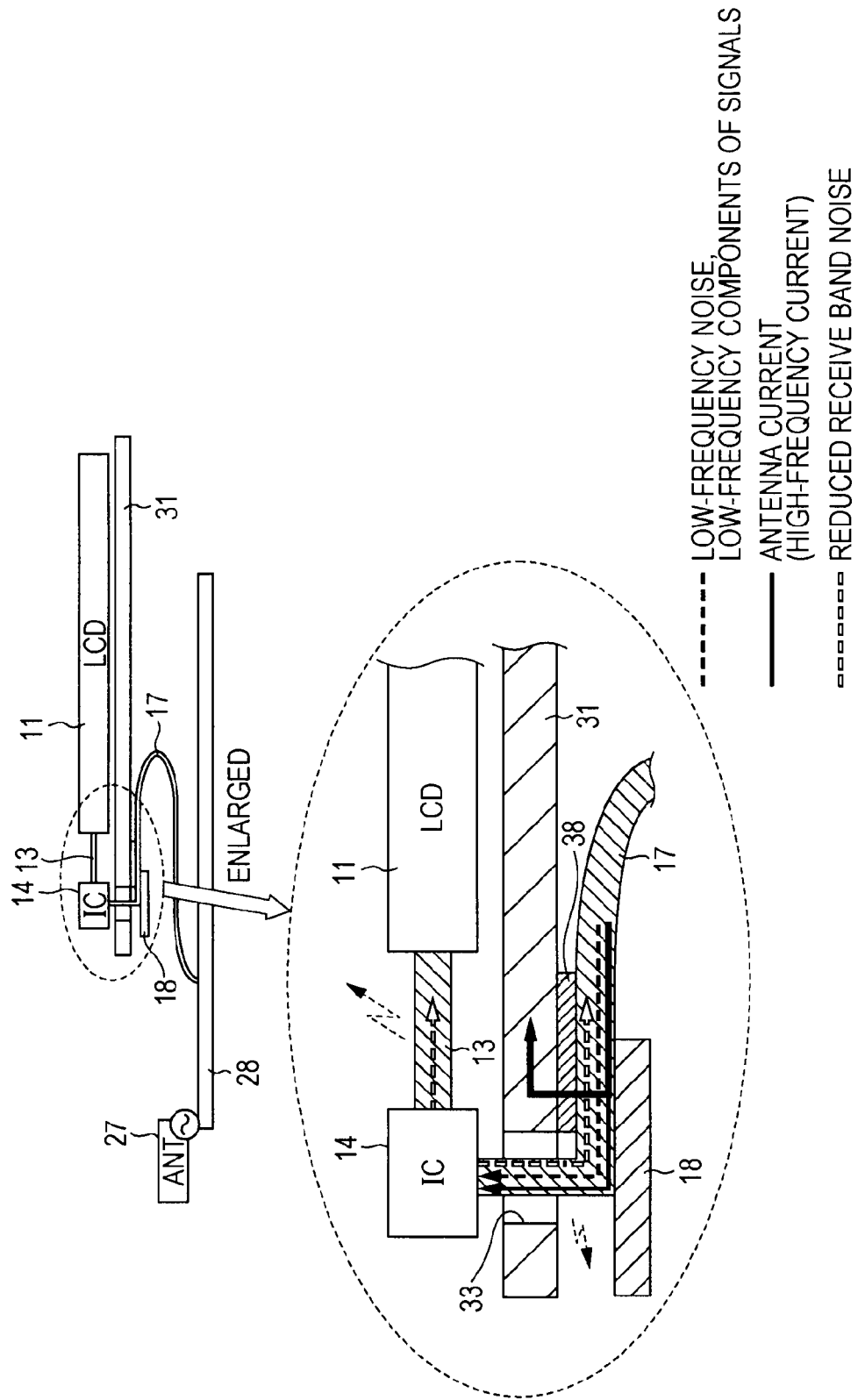
FIG. 14 illustrates an example configuration of a second embodiment according to the present disclosure.

FIG. 14 illustrates an example configuration of a second embodiment according to the present disclosure. The first embodiment is structured such that, with (improvement of) the capacitive coupling between the FPC 17 and the reinforcement plate 18, the antenna current flowing in the FPC 17 is introduced into the fixed plate 31 through the reinforcement plate 18. In contrast, in the second embodiment, the antenna current flowing in the FPC 17 directly flows into the fixed plate 31 without passing through the reinforcement plate 18. For that purpose, an electrically conductive adhesive sheet (electrically conductive sheet member) 38 is used to attach a back surface of the FPC 17 (surface opposite the reinforcement plate 18 side) to the surface of the fixed plate 31. With this structure, part of the antenna current flowing in the FPC 17 is branched into the fixed plate 31 in order to reduce the amount of the current that flows into the nonlinear element. In FIG. 14, the resist layer of the FPC isolates the GND and other lines of the FPC 17 from the electrically conductive adhesive sheet 38. The electrically conductive adhesive sheet 38 and the GND and other lines of the FPC 17 are coupled so as to block DC but allow AC to flow therebetween. Thus, only the high-frequency antenna current is branched, and the low-frequency signals and noise having been introduced into the FPC are not branched (as described above, to be exact, low-frequency signals also branch although the ratios thereof compared to the high-frequency current are small). When the adhesive sheet 38 is thin, the FPC 17 and the fixed plate 31 are positioned close to each other and the coupling capacitance therebetween increases. However, when the adhesive sheet 38 is not electrically conductive, the thickness of an insulating layer between the two conductor layers (conductors in the FPC 17 and the fixed plate 31) increases. In contrast, when the adhesive sheet 38 is formed of an electrically conductive material, the increase in the thickness of the insulating layer can be prevented. As a result, the coupling capacitance between the FPC 17 and the fixed plate 31 can be further increased.

In this sense, also with the structure illustrated in FIG. 6, when the FPC 17 is directly disposed near the fixed plate 31 by a function of the electrically conductive connecting member 19, part of the antenna current flowing in the FPC 17 should be directly introduced into the fixed plate 31 from the FPC 17. However, as illustrated in FIG. 6, the reinforcement plate 18 is disposed in a position that opposes the opening 33 of the fixed plate 31. This may prevent an enlargement of an area where the FPC 17 and the fixed plate 31 are close to each other. In contrast, with the structure illustrated in FIG. 14, such a disadvantage can be reduced by comparatively enlarging an area of the electrically conductive adhesive sheet 38.

The structure illustrated in FIG. 14 can also be used in combination with the structure illustrated in FIG. 6. That is, also with the structure in FIG. 14, by electrically connecting the reinforcement plate 18 and the fixed plate 31 using the electrically conductive connecting member 19, part of the antenna current flowing in the FPC 17 can be introduced into the reinforcement plate 18 also through the reinforcement plate 18.

Figure 15A:
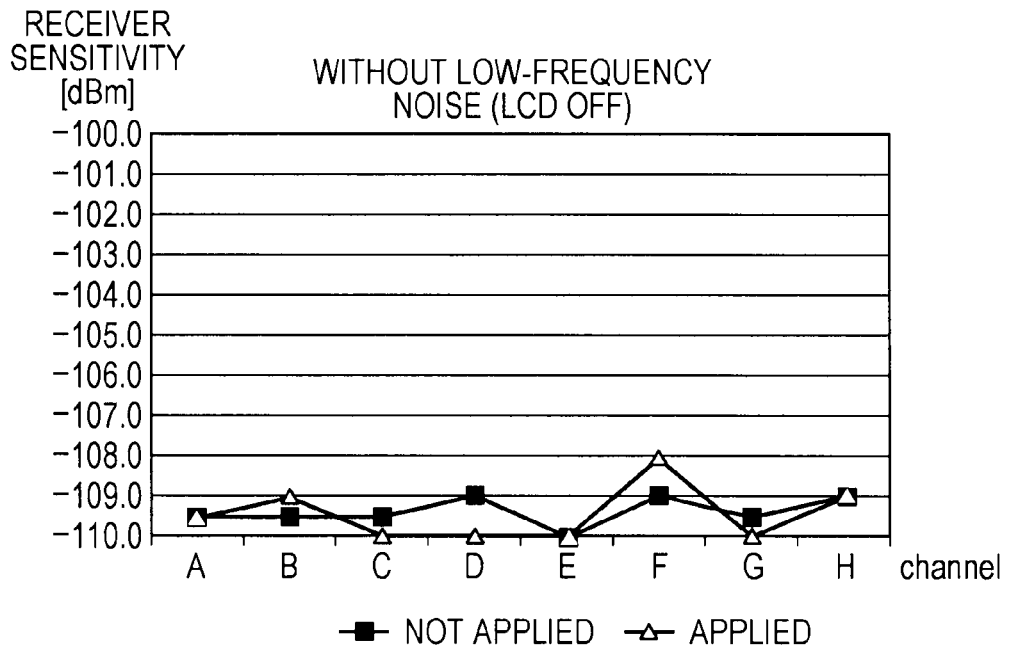
FIGS. 15A and 15B are graphs illustrating results of experiments with actual mobile terminals to which the present disclosure has been applied.
Figure 15B:
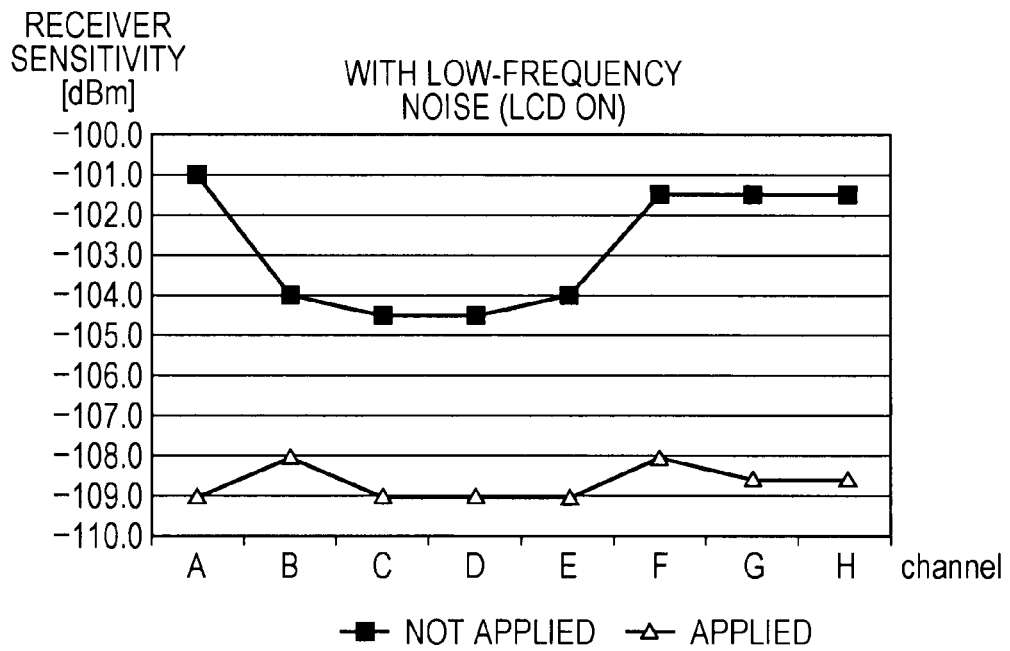

FIGS. 15A and 15B are graphs illustrating results of experiments with the actual mobile terminals to which (the first embodiment of) the present disclosure has been applied. The graphs illustrate receiver sensitivity characteristics obtained with the mobile terminals in the open state when the mobile terminals are operated in Band Class 0 of the CDMA 2000 system. In each graph, channels (Channel) are represented along a horizontal axis and receiver sensitivity in [dBm] is represented along a vertical axis. FIG. 15A illustrates a graph that represents, when low-frequency noise is not present in the FPC 17 (LCD_OFF state), a case in which the present disclosure has not been applied to the mobile terminal ("NOT APPLIED") and another case in which the present disclosure has been applied to the mobile terminal ("APPLIED"). FIG. 15B illustrates a graph that represents, when low-frequency noise is present in the FPC 17 (LCD_ON state), a case in which the present disclosure has not been applied to the mobile terminal ("NOT APPLIED") and another case in which the present disclosure has been applied to the mobile terminal ("APPLIED").

As illustrated in FIG. 15A, when low-frequency noise is not present in the FPC, whether or not the present disclosure is applied does not affect the receiver sensitivity. In contrast, as can be seen in FIG. 15B, when low-frequency noise is present in the FPC (LCD_ON state), the receiver sensitivity has been significantly (by 4.5 dB to 8 dB) improved in the case in which the present disclosure is "APPLIED" to the mobile terminal compared to the case in which the present disclosure is "NOT APPLIED" to the mobile terminal. In the case in which the present disclosure is applied to the mobile terminal, sensitivity differences among channels are also small (1 dB or smaller). These are desirable characteristics.

The following advantages can be obtained in accordance with the embodiments of the present disclosure.

(1) Receive band noise generated by the input of the transmission antenna current in addition to low-frequency signals, clock signals, and noise flowing in the FPC to the nonlinear element connected to the FPC can be reduced (that is, degradation of the receiver sensitivity due to self jamming can be reduced).

(2) Receive band noise, which is generated by the input of the transmission antenna current flowing in the FPC, and noise, signals, clock signals, and so forth within the IC to the nonlinear element connected to the FPC can be reduced (that is, degradation of the receiver sensitivity due to self jamming can be reduced).

(3) For the nonlinear element connected to the FPC, receive band noise, which is generated by modulation of the transmission antenna current and an antenna current of another system being simultaneously operable, can be reduced (that is, degradation of the receiver sensitivity due to self jamming can be reduced). The "antenna current of another system" in question here is assumed to be a transmission signal and its harmonic component, internal local signals and their harmonic components in transmission and reception.

(4) Spurious generated by the input of the transmission antenna current to the nonlinear element connected to the FPC can be reduced (that is, effects to surrounding electronics can be reduced).

(5) By reducing the antenna current flowing in the FPC, malfunctions of the IC connected to the FPC can be reduced.

(6) The reinforcement plate (conductor plate) used to branch the antenna current flowing in the FPC is coupled to the FPC so as to allow AC to flow therebetween. Thus, low-frequency signals and noise that flow in the FPC are not spread to a branch target but only the antenna current can be branched (that is, effects that affect other systems, which are simultaneously operable with the system according to the present disclosure and use lower frequency bands, can be avoided).

(7) Measures according to the present disclosure can be easily implemented. Thus, the measures can be additionally implemented with ease in an ongoing prototyping project of a terminal in developing and manufacturing the terminal.

(8) Except when the regulator circuits illustrated in FIG. 12 are provided, the measures can be implemented without using filters.

(9) When the regulator circuits illustrated in FIG. 12 are provided, the frequency selectivity according to the present disclosure can be improved. Thus, effects of the present disclosure affecting waveform quality of signals flowing in the FPC can be further reduced.

(10) When the present disclosure is applied to a slide-type mobile terminal, existing slide connecting members can be utilized and large-sized additional components are not necessary.

Preferred embodiments of the present disclosure have been described above. A variety of modifications and changes other than what has been described above can also be implemented. For example, although the slide-type mobile terminal has been described, the type of the mobile terminal is not limited thereto as long as a component corresponding to the above-described electrically conductive fixed plate (electrically conductive plate) can be utilized.

Although a structure in which the relay FPCs 17 and 13 are connected to each other with the connectors 15 and 16 has been described, the relay FPCs 17 and 13 can be integrated into one unit. In that case, the connectors 15 and 16 are not required. This is also true for the connectors 22 and 23.

Although the fixed plate 31 and the movable plate 32, which are included in the slide connecting member 30, are illustrated as substantially plate-like solid member except for the opening, the actual structure may be more complex. The fixed plate 31 and the movable plate 32 may have frame structures.

What is claimed is:

1. A mobile terminal, comprising:
   a first casing;
   a second casing configured to be connected to the first casing;
   an electrically conductive plate disposed inside either of the first casing and the second casing or between the first casing and the second casing;
   a flexible printed circuit board configured to connect the first casing and the second casing;
   an electrically conductive reinforcement member connected to a surface of a portion of the flexible printed circuit board;
   a plurality of electrically conductive connecting members that each pass through openings of, and are in direct contact with, the electrically conductive reinforcement member and the electrically conductive plate; and
   a circuit board disposed between the flexible printed circuit board and the electrically conductive plate, the circuit board including
   a first conductive area;
   a second conductive area;
   a third conductive area, wherein the first, second and third conductive areas are separated from each other;
   a first regulator circuit having frequency selectivity and disposed between the first conductive area and the second conductive area; and
   a second regulator circuit having frequency selectivity and disposed between the second conductive area and the third conductive area.

2. The mobile terminal of claim 1, further comprising:
   an antenna disposed in at least one of the first and second casings.

3. The mobile terminal of claim 1, wherein the first and second casings are connected so as to be openable and closable.

4. The mobile terminal of claim 1, wherein the electrically conductive reinforcement member includes an electrically conductive reinforcement plate.

5. The mobile terminal of claim 1, wherein the electrically conductive connecting members are configured to attach the electrically conductive reinforcement member to the electrically conductive plate.

6. The mobile terminal of claim 1, wherein the electrically conductive connecting members are electrically conductive fastening members configured to conduct electricity between the electrically conductive reinforcement member and the electrically conductive plate.

7. The mobile terminal of claim 6, wherein the electrically conductive fastening members are configured to attach the electrically conductive reinforcement member to the electrically conductive plate.

8. The mobile terminal of claim 1, wherein each of the first and second regulator circuits includes a component configured to perform frequency selection.

9. The mobile terminal of claim 8, wherein each of the first and second regulator circuits include a filter including at least one of an inductor and a capacitor and a resistor.

10. The mobile terminal of claim 8, wherein each of the first and second regulator circuits include a filter including a distributed constant circuit.

11. The mobile terminal of claim 1, wherein the plurality of electrically conductive connecting members each pass through openings of, and are in direct contact with, the electrically conductive reinforcement member, the flexible printed circuit board, and the electrically conductive plate.

12. The mobile terminal of claim 1, wherein the plurality of electrically conductive connecting members includes a plurality of metal screws that are screwed into a pair of screw hole openings of each of the electrically conductive reinforcement member and the electrically conductive plate.

13. The mobile terminal of claim 1, wherein the plurality of electrically conductive connecting members includes a plurality of metal screws that are screwed into a pair of screw hole openings of each of the electrically conductive reinforcement member, the flexible printed circuit board, and the electrically conductive plate.

14. A case connecting structure configured to connect a first casing and a second casing of a mobile terminal, the case connecting structure comprising:
   an electrically conductive plate disposed inside either of the first and second casings or between the first and second casings;
   a flexible printed circuit board configured to connect the first casing and the second casing;
   an electrically conductive reinforcement plate secured to a surface of a portion of the flexible printed circuit board;
   a plurality of electrically conductive connecting members that each pass through openings of, and are in direct contact with, the reinforcement plate and the electrically conductive plate; and
   a circuit board disposed between the flexible printed circuit board and the electrically conductive plate, the circuit board including
   a first conductive area;
   a second conductive area;
   a third conductive area, wherein the first, second and third conductive areas are separated from each other;
   a first regulator circuit having frequency selectivity and disposed between the first conductive area and the second conductive area; and
   a second regulator circuit having frequency selectivity and disposed between the second conductive area and the third conductive area.

15. The case connecting structure of claim 14, wherein the electrically conductive connecting members are configured to attach the electrically conductive reinforcement plate to the electrically conductive plate.

16. The case connecting structure of claim 14, wherein the electrically conductive connecting members are electrically conductive fastening members configured to conduct electricity between the electrically conductive reinforcement member and the electrically conductive plate.

17. The case connecting structure of claim 14, wherein each of the first and second regulator circuits includes a component configured to perform frequency selection.

\* \* \* \* \*